United States Patent
Okumura et al.

(10) Patent No.: US 6,496,433 B2
(45) Date of Patent: Dec. 17, 2002

(54) SEMICONDUCTOR DEVICE AND SEMICONDUCTOR DEVICE TESTING METHOD

(75) Inventors: Yasuhiro Okumura, Kawasaki (JP); Yoshitaka Takahashi, Kawasaki (JP); Akihiro Funyu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

(21) Appl. No.: 09/756,198

(22) Filed: Jan. 9, 2001

(65) Prior Publication Data

US 2001/0017802 A1 Aug. 30, 2001

(30) Foreign Application Priority Data

Feb. 29, 2000 (JP) ........................................ 2000-054878

(51) Int. Cl.$^7$ ................................................. G11C 7/00
(52) U.S. Cl. ...................... 365/201; 365/200; 371/21.4; 371/21.1; 371/22.5
(58) Field of Search ................................. 365/201, 200; 371/21.4, 21.1, 22.5

(56) References Cited

U.S. PATENT DOCUMENTS 5,703,495 A * 12/1997 Sartwell et al. ............ 324/763
5,790,459 A * 8/1998 Roohparvar ............ 365/185.21
5,956,277 A * 9/1999 Roohparvar ................. 365/201
6,028,443 A * 2/2000 Ozaki ............................ 326/16
6,331,958 B2 * 12/2001 Tsukude ....................... 365/201

* cited by examiner

Primary Examiner—David Nelms
Assistant Examiner—Connie C. Yoha
(74) Attorney, Agent, or Firm—Arent Fox Kintner Plotkin & Kahn, PLLC

(57) ABSTRACT

A semiconductor device has a normal mode and a test mode for testing the semiconductor device, and is provided with a first circuit which receives an input signal, a test signal and an output enable signal, and outputs the input signal in response to the output enable signal, a second circuit which is coupled to the first circuit and outputs the input signal obtained from the first circuit, and power supply pads which receive a power supply voltage which is supplied in common to the first circuit and the second circuit. The first circuit fixes an output impedance of the second circuit to a high-impedance regardless of the output enable signal when the test signal indicates the test mode.

6 Claims, 4 Drawing Sheets

(a) test
(b) cdbz
(c) odex
(d) dq

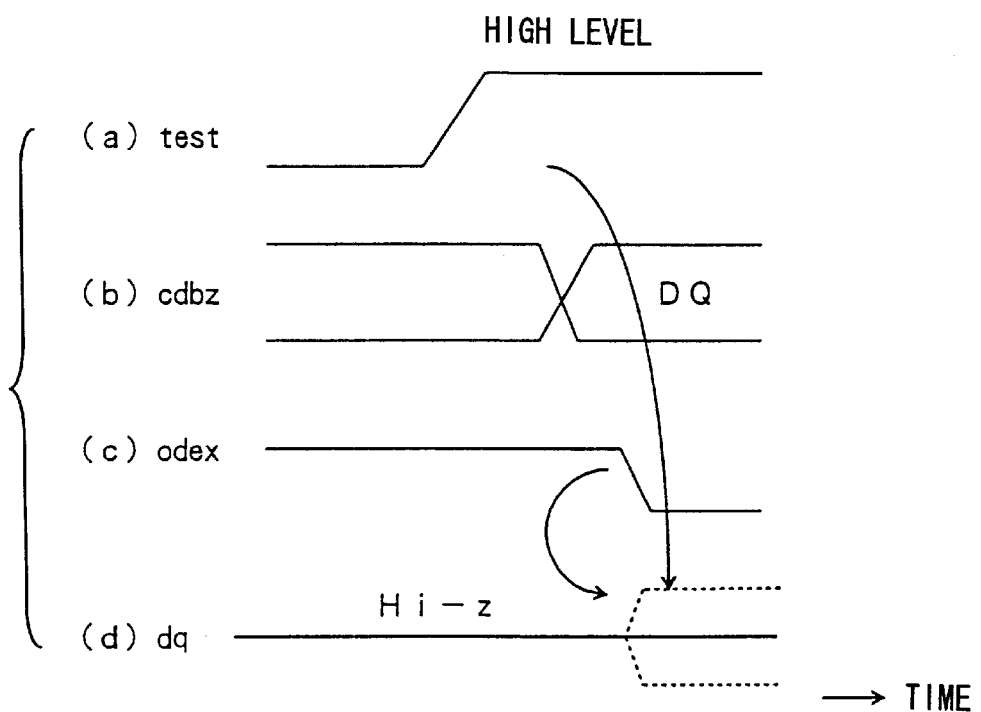

SEMICONDUCTOR DEVICE AND SEMICONDUCTOR DEVICE TESTING METHOD

BACKGROUND OF THE INVENTION

This application claims the benefit of a Japanese Patent Application No.2000-054878 filed Feb. 29, 2000, in the Japanese Patent Office, the disclosure of which is hereby incorporated by reference.

1. Field of the Invention

The present invention generally relates to semiconductor devices and semiconductor device testing methods, and more particularly to a semiconductor device having a test mode, and to a semiconductor device testing method for testing such a semiconductor device.

Generally, when guaranteeing functions and performances of semiconductor devices such as semiconductor memory devices at the time of forwarding the semiconductor devices or, when a user checks abnormalities of the semiconductor device, a command is input to the semiconductor device to switch an operation mode thereof to a test mode, so as to carry out various kinds of tests. The switching of the operation mode of the semiconductor device from a normal mode to the test mode is often referred to as a test mode entry.

2. Description of the Related Art

In a conventional synchronous dynamic random access memory (SDRAM), the test mode entry is made by inputting a command to the SDRAM in synchronism with an external clock, for example. In addition, in a case where the command is determined by a predetermined combination of signals such as a chip select signal and an address strobe signal, the test mode entry is erroneously made if the predetermined combination of the signals occurs accidentally. Accordingly, it is possible to use a command signal exclusively for switching the operation mode of the semiconductor device to the test mode.

On the other hand, in an asynchronous DRAM, it is not possible to employ a test mode entry system of the type employed in the SDRAM, because the asynchronous DRAM does not use an external clock. Thus, in one example of the conventional asynchronous DRAM, the test mode entry is made by applying a super-high voltage which is higher than a voltage which is normally applied with respect to the asynchronous DRAM.

In addition, the DRAM is supplied with a core power supply voltage and an output power supply voltage. The core power supply voltage is used in a core section of the DRAM, such as peripheral circuits and a memory cell array within the DRAM. The output power supply voltage is used in an output section of the DRAM, such as an output circuit within the DRAM. Normally, mutually different voltages are used for the core power supply voltage and the output power supply circuit, and for this reason, the core power supply voltage and the output power supply voltage are supplied to the DRAM via mutually different power supply pads. However, regardless of whether the DRAM is the synchronous or the asynchronous type, there are demands to reduce the number of pads in order to improve the integration density of the DRAM. Hence, with regard to the power supply pads, it is conceivable to use the same voltage for the core power supply voltage and the output power supply voltage, so that the core power supply voltage and the output power supply voltage can be supplied to the DRAM via common power supply pads.

However, if the conventional DRAM were constructed to use the common power supply pads for supplying the core power supply voltage and the output power supply voltage to the DRAM, and the core power supply voltage is supplied to the DRAM in the test mode in order to measure an active current in the core section, for example, this core power supply voltage would also be supplied to the output section of the DRAM. Consequently, it would become impossible to separate the active current and an output current from the output circuit within the DRAM, for example, thereby making it impossible to carry out the originally intended test during the test mode.

Therefore, in the conventional semiconductor devices, if an attempt is made to supply the same power supply voltage via the common power supply pads to the circuits which are mutually connected but are originally supplied with mutually different power supply voltages, there was a problem in that it is impossible to carry out the originally intended test with respect to the semiconductor device during the test mode.

SUMMARY OF THE INVENTION

Accordingly, it is a general object of the present invention to provide a novel and useful semiconductor device and semiconductor device testing method, in which the problems described above are eliminated.

Another and more specific object of the present invention is to provide a semiconductor device and a semiconductor device testing method, which enable the originally intended test to be carried out with respect to the semiconductor device during the test mode, even when the same power supply voltage is supplied via the common power supply pads to circuits which are mutually connected but are originally supplied with mutually different power supply voltages.

Still another object of the present invention is to provide a semiconductor device having a normal mode and a test mode for testing the semiconductor device, comprising a first circuit which receives an input signal, a test signal and an output enable signal, and outputs the input signal in response to the output enable signal, a second circuit which is coupled to the first circuit and outputs the input signal obtained from the first circuit, and power supply pads which receive a power supply voltage which is supplied in common to the first circuit and the second circuit, where the first circuit fixes an output impedance of the second circuit to a high-impedance regardless of the output enable signal when the test signal indicates the test mode. According to the semiconductor device of the present invention, it is possible to carry out the originally intended test with respect to the semiconductor device during the test mode, even when the same power supply voltage is supplied via the common power supply pads to circuits which are mutually connected but are originally supplied with mutually different power supply voltages.

The semiconductor device may further comprise a memory section which outputs the input signal to the first circuit. In addition, the semiconductor device may further comprise a logic circuit which generates the output enable signal based on a command signal, and a test mode judging circuit which generates the test signal based on the command signal and an address signal.

A further object of the present invention is to provide a semiconductor device testing method for testing a semiconductor device in a test mode, where the semiconductor device also has a normal mode and is constructed to supply a common power supply voltage to first and second circuits thereof which are mutually coupled, and the semiconductor device testing method comprises the steps of (a) controlling the first circuit to output an input signal to the second circuit in response to an output enable signal when a test signal indicates the normal mode, and (b) measuring a current at an arbitrary node within the first circuit in a state where an output impedance of the second circuit is fixed to a high-impedance, regardless of the output enable signal, when the test signal indicates the test mode. According to the semiconductor device testing method of the present invention, it is possible to carry out the originally intended test with respect to the semiconductor device during the test mode, even when the same power supply voltage is supplied via the common power supply pads to circuits which are mutually connected but are originally supplied with mutually different power supply voltages.

The semiconductor device testing method may further comprise the step of (c) outputting the input signal from a memory section to the first circuit. In addition, the semiconductor device testing method may further comprise the steps of (d) generating the output enable signal based on a command signal, and (e) generating the test signal based on the command signal and an address signal.

Other objects and further features of the present invention will be apparent from the following detailed description when read in conjunction with the accompanying drawings.

BRIEF DESCRIPTION OF THE DRAWINGS

FIG. 4 is a timing chart for explaining the operations of the control circuit and the output circuit during a test mode.

DESCRIPTION OF THE PREFERRED EMBODIMENTS

Figure 1:
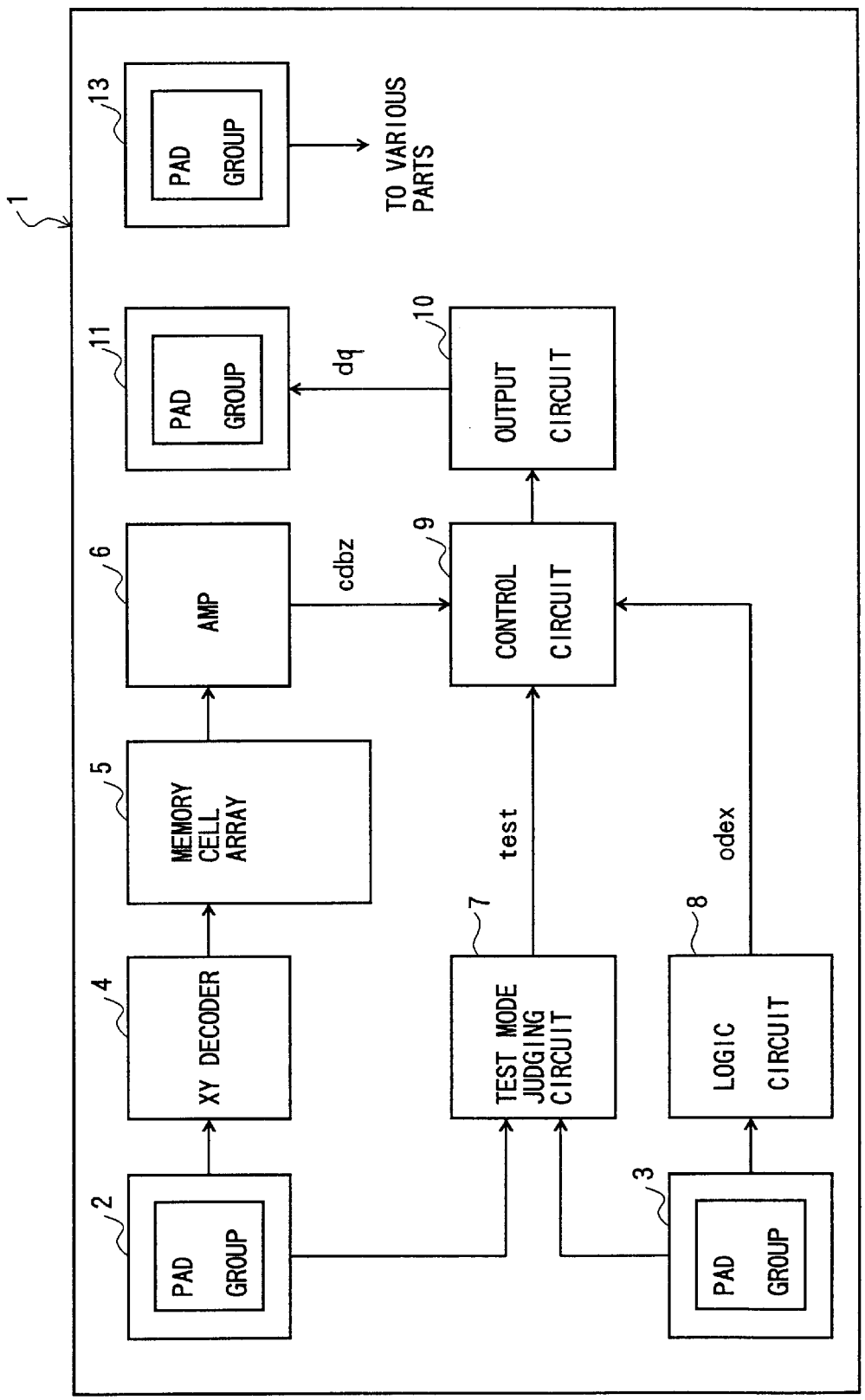
FIG. 1 is a system block diagram showing an embodiment of a semiconductor device according to the present invention.

A description will be given of embodiments of a semiconductor device according to the present invention and a semiconductor device testing method according to the present invention, by referring to the drawings.

FIG. 1 is a system block diagram showing an embodiment of the semiconductor device according to the present invention. This embodiment of the semiconductor device employs an embodiment of the semiconductor device testing method according to the present invention. In this embodiment, the present Invention is applied to an asynchronous DRAM, but the present invention is of course similarly applicable to other semiconductor devices and semiconductor memory devices such as a SDRAM.

An asynchronous DRAM 1 generally includes an address pad group 2, a command pad group 3, a XY decoder 4, a memory cell array 5, an amplifier 6, a test mode judging circuit 7, a logic circuit 8, a control circuit 9, and output circuit 10, an output pad group 11, and a power supply pad group 13 which are connected as shown in FIG. 1. For the sake of convenience, FIG. 1 only shows circuit parts of the DRAM 1 related to a test mode.

The address pad group 2 is made up of a plurality of address pads which receive an address signal. The XY decoder 4 decodes the address signal from the address pad group 2, and specifies a X-address and a Y-address of the memory cell array 5. A data can be written to and read from the memory cell array 5 by known methods, and thus, a description of write and read operations will be omitted in this specification. The amplifier 6 amplifies the data which is read onto a common data bus from the specified XY addresses of the memory cell array 5, and outputs the amplified data to the control circuit 9 as a data "cdbz".

The command pad group 3 is made up of a plurality of command pads which receive various kinds of commands, including a write command and a read command. A command signal from the command pad group 3 is supplied to the test mode judging circuit 7 and the logic circuit 8. The test mode judging circuit 7 judges whether an operation mode of the DRAM 1 is a normal mode or a test mode, based on the address signal and the command signal. If the operation mode is judged as being the test mode, the test mode judging circuit 7 supplies a test signal "test" to the control circuit 9. On the other hand, the logic circuit 8 carries out various kinds of logic operations based on the command signal, and supplies an output enable signal "odex" which indicates a result of a timing judgement or the like to the control circuit 9.

The test signal "test" from the test mode judging circuit 7 disables the control circuit 9 from outputting the data "cdbz" from the amplifier 6. On the other hand, an output enable signal "odex" from the logic circuit 8 enables the control circuit 9 to output the data "cdbz" from the amplifier 6. In the normal mode, the test signal "test" has a low level, and the control circuit 9 controls an output impedance of the output circuit 10 to a high-impedance or a low-impedance, depending on a level of the output enable signal "odex" during the read operation. On the other hand, in the test mode, the test signal "test" has a high level, and as will be described later, the control circuit 9 guarantees the output impedance of the output circuit 10 to be a high-impedance regardless of the level of the output enable signal "odex", and no output current flows in this embodiment.

The output circuit 10 includes output transistors, and outputs the data "ncdbz" which is obtained from the amplifier 6 via the control circuit 9 to the output pad group 11 as an output data "dq". The output pad group 11 is made up of a plurality of output pads. The power supply pad group 13 is made up of a plurality of power supply pads which receive at least one power supply voltage. In this embodiment, the power supply pad group 11 is made up of at least one power supply pad which receives a power supply voltage vdd and a power supply pad which is connected to a ground vss, and the power supply voltage vdd is used in common as an output power supply voltage and a core power supply voltage. The output power supply voltage refers to the power supply voltage which is which is supplied to an output section such as the output circuit 10. On the other hand, the core power supply voltage refers to the power supply voltage which is supplied to a core section including peripheral circuits such as the memory cell array 5 and the control circuit 9. In FIG. 1, the layout or placement of each of the pad groups 2, 3, 11 and 13 does not correspond to the actual layout or placement, and the locations of the pad groups 2, 3, 11 and 13 may be set arbitrarily.

Figure 2:
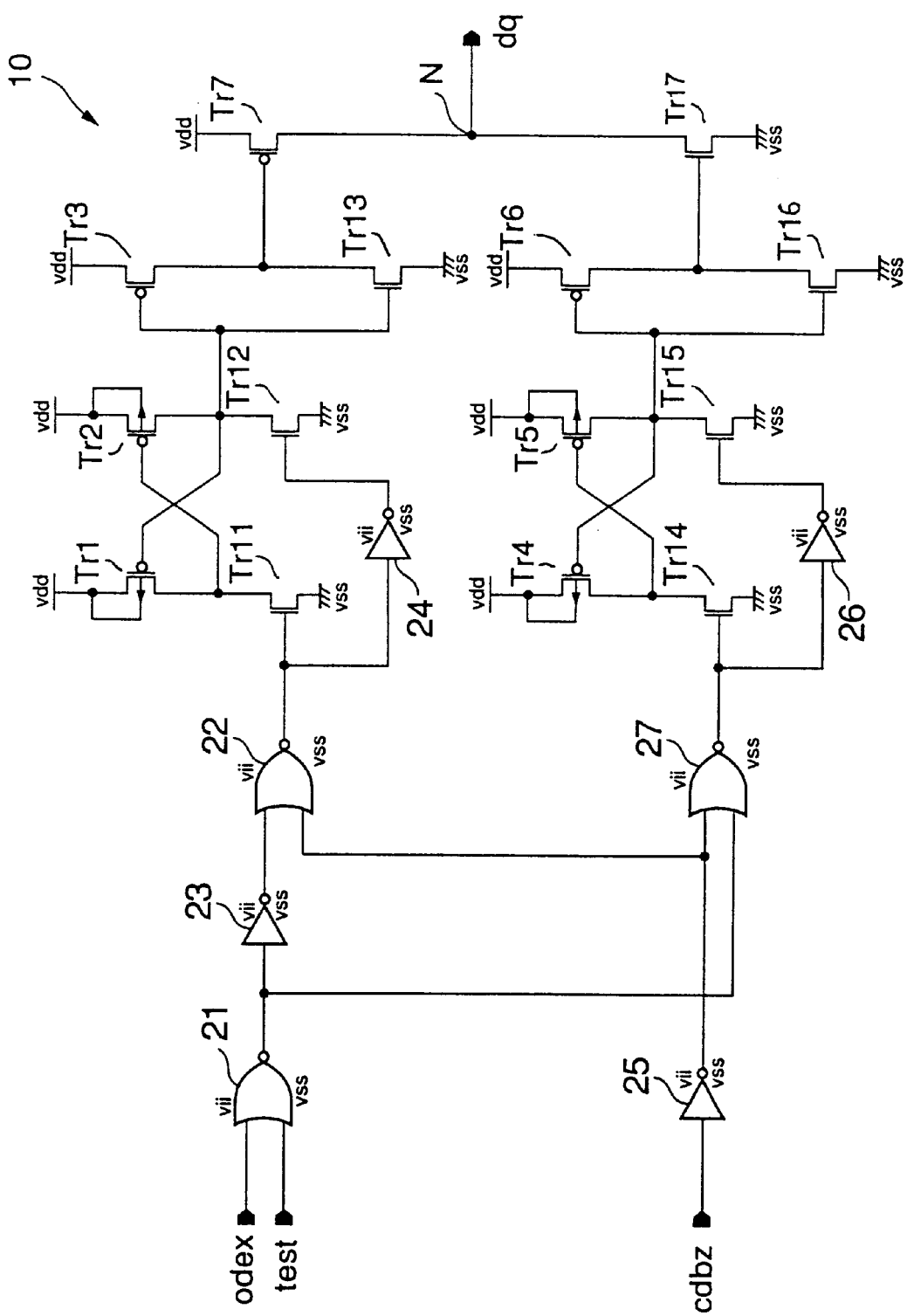
FIG. 2 is a circuit diagram showing an embodiment of a control circuit and an output circuit.

FIG. 2 is a circuit diagram showing an embodiment of the control circuit 9 and the output circuit 10. The control circuit 9 includes NOR gates 21 and 22, inverters 23 through 26, a NAND gape 27, P-channel transistors Tr1 through Tr7, and N-channel transistor Tr11 through Tr17 which are connected as shown in FIG. 2. The output circuit 10 includes at least the P-channel output transistor Tr7 and the N-channel output transistor Tr17. In FIG. 2, the power supply voltage vdd is supplied from the power supply pad group 13 for use in common as the core power supply voltage and the output power supply voltage, and vss denotes the ground. In addition, vii denotes an internal power supply voltage which is supplied from an internal power supply generated by a known power supply circuit within the DRAM 1 based on the power supply voltage vdd or the like.

The output enable signal "odex" from the logic circuit 8 and the test signal "test" from the test mode judging circuit 7 are supplied to the NOR gate 21. In addition, the data "cdbz" from the amplifier 6 is supplied to the inverter 25. The output data "dq" is output from a node N which connects the P-channel output transistor Tr7 and the N-channel output transistor Tr17.

Figure 3:
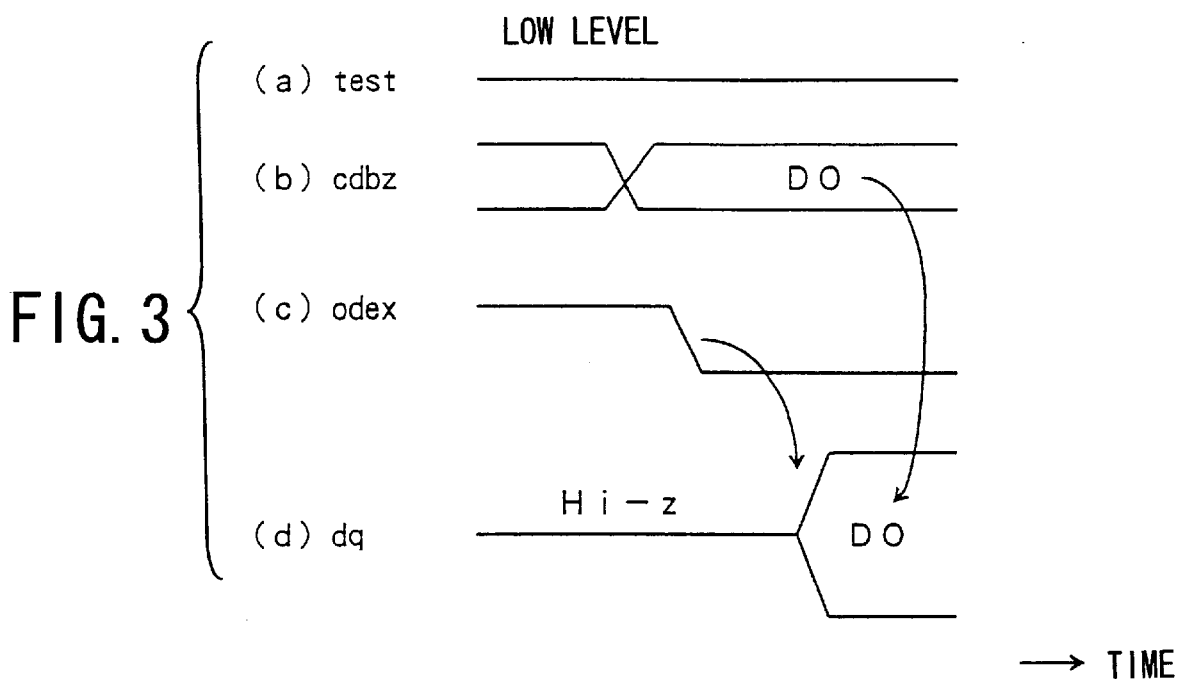
FIG. 3 is a timing chart for explaining operations of the control circuit and the output circuit during a read operation.

FIG. 3 is a timing chart for explaining operations of the control circuit 9 and the output circuit 10 during the read operation of the DRAM 1. In addition, FIG. 4 is a timing chart for explaining the operations of the control circuit 9 and the output circuit 10 during the test mode of the DRAM 1. In FIGS. 3 and 4, Hi-z denotes the high-impedance.

In the normal mode such as during the read operation, the test signal "test" has a low level as shown in FIG. 3(a), and the control circuit 9 controls the output impedance of the output circuit 10 to the high-impedance or the low-impedance depending on the level of the output enable signal "odex" during the read operation shown in FIG. 3(c). In other words, the P-channel output transistor Tr7 or the N-channel output transistor Tr17 turns ON depending on the level of the output enable signal "odex", and the data "cdbz" shown in FIG. 3(b) is output and supplied to the output pad group 11 as the output data "dq" shown in FIG. 3(d).

On the other hand, during the test mode, the test signal "test" has a high level as shown in FIG. 4(a), and the control circuit 9 guarantees the output impedance of the output circuit 10 to the high-impedance regardless of the level of the output enable signal "odex" shown in FIG. 4(c). In other words, because the control circuit 9 fixes the output impedance of the output circuit 10 to the high-impedance regardless of the data "cdbz" shown in FIG. 4(b) and the output enable signal "odex" shown in FIG. 4(c), no output current flows from the node N of the output circuit 10, as may be seen from FIG. 4(d).

Therefore, when carrying out a test in the test mode by measuring the active current at an arbitrary mode within the control circuit 9, for example, no output current flows in the output circuit 10, and the active current can thus be measured accurately by separating the active current from the output current, without being affected by the output current, even though the same power supply voltage vdd is used as the core power supply voltage and the output power supply voltage.

Further, the present invention is not limited to these embodiments, but various variations and modifications may be made without departing from the scope of the present invention.

What is claimed is:

1. A semiconductor device having a normal mode and a test mode for testing the semiconductor device, comprising:

a first circuit which receives an input signal, a test signal and an output enable signal, and outputs a first signal in response to the output enable signal;

a second circuit which is coupled to said first circuit and outputs a second signal in response to the first signal obtained from said first circuit; and power supply pads which receive a power supply voltage which is supplied in common to said first circuit and said second circuit, said first circuit fixing an output impedance of said second circuit to a high-impedance regardless of the output enable signal when the test signal indicates the test mode.

2. The semiconductor device as claimed in claim 1, further comprising:

a memory section which outputs the input signal to said first circuit.

3. The semiconductor device as claimed in claim 2, further comprising:

a logic circuit which generates the output enable signal based on a command signal; and a test mode judging circuit which generates the test signal based on the command signal and an address signal.

4. A semiconductor device testing method for testing a semiconductor device in a test mode, said semiconductor device also having a normal mode and being constructed to supply a common power supply voltage to first and second circuits thereof which are mutually coupled, said semiconductor device testing method comprising the steps of:

(a) controlling the first circuit to output an input signal to the second circuit in response to an output enable signal when a test signal indicates the normal mode; and (b) measuring a current at an arbitrary node within the first circuit in a state where an output impedance of the second circuit is fixed to a high-impedance, regardless of the output enable signal, when the test signal indicates the test mode.

5. The semiconductor device testing method as claimed in claim 4, further comprising the step of:

(c) outputting the input signal from a memory section to the first circuit.

6. The semiconductor device testing method as claimed in claim 5, further comprising the steps of:

(d) generating the output enable signal based on a command signal; and (e) generating the test signal based on the command signal and an address signal.

* * * * *